(12) United States Patent
Zhou et al.

(10) Patent No.: US 11,289,331 B2
(45) Date of Patent: Mar. 29, 2022

(54) METHODS FOR GRAPHENE FORMATION USING MICROWAVE SURFACE-WAVE PLASMA ON DIELECTRIC MATERIALS

(71) Applicant: Applied Materials, Inc., Santa Clara, CA (US)

(72) Inventors: Jie Zhou, San Jose, CA (US); Erica Chen, Cupertino, CA (US); Qiwei Liang, Fremont, CA (US); Chentsau Chris Ying, Cupertino, CA (US); Srinivas D. Nemani, Sunnyvale, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/585,929

(22) Filed: Sep. 27, 2019

(65) Prior Publication Data
US 2020/0105525 A1 Apr. 2, 2020

Related U.S. Application Data

(60) Provisional application No. 62/737,868, filed on Sep. 27, 2018.

(51) Int. Cl.
*H01L 21/02* (2006.01)
*C23C 16/02* (2006.01)
*C23C 16/26* (2006.01)

(52) U.S. Cl.
CPC ........ *H01L 21/02527* (2013.01); *C23C 16/02* (2013.01); *C23C 16/26* (2013.01); *H01L 21/0262* (2013.01); *H01L 21/02425* (2013.01); *H01L 21/02488* (2013.01)

(58) Field of Classification Search
CPC ......... H01L 21/02527; H01L 21/02425; H01L 21/02488; H01L 21/0262; C23C 16/02; C23C 16/26
See application file for complete search history.

(56) References Cited

U.S. PATENT DOCUMENTS

| 2012/0244281 | A1* | 9/2012 | Fox | C23C 16/56 427/250 |
|---|---|---|---|---|
| 2013/0243969 | A1* | 9/2013 | Teng | B82Y 30/00 427/539 |
| 2015/0337458 | A1* | 11/2015 | Duan | C01B 32/186 428/220 |
| 2019/0085457 | A1* | 3/2019 | Ifuku | C23C 16/45561 |
| 2020/0105524 | A1* | 4/2020 | Shin | C01B 32/186 |

OTHER PUBLICATIONS

Umeno, M. et al., "Diamond-like carbon thin films by microwave surface-wave plasma CVD aimed for the application of photovoltaic solar cells," 2005, Diamond & Related Materials, vol. 14, pp. 1973-1979. (Year: 2005).*

(Continued)

*Primary Examiner* — Michael Jung
(74) *Attorney, Agent, or Firm* — Servilla Whitney LLC

(57) ABSTRACT

A method of forming graphene layers is disclosed. A method of improving graphene deposition is also disclosed. Some methods are advantageously performed at lower temperatures. Some methods advantageously provide graphene layers with lower resistance. Some methods advantageously provide graphene layers in a relatively short period of time.

20 Claims, 2 Drawing Sheets

(56) References Cited

OTHER PUBLICATIONS

Adhikari S. et al., "Catalyst-Free Growth of Graphene by Microwave Surface Wave Plasma Chemical Vapor Deposition at Low Temperature," 2016, vol. 4, pp. 10-14. (Year: 2016).*
Chen, Xiangping, et al., "Synthetic Metals", Elsevier Journal, Synthetic Metals 210 (2015) 95-108, Jul. 21, 2015, 1-14.
Kim, Soo Min, et al., "The effect of copper pre-cleaning on graphene synthesis", IOP Publishing, Nanotechnology 24 (2013) 365602, Aug. 13, 2013, 1-7.

* cited by examiner

METHODS FOR GRAPHENE FORMATION USING MICROWAVE SURFACE-WAVE PLASMA ON DIELECTRIC MATERIALS

CROSS-REFERENCE TO RELATED APPLICATIONS

This application claims priority to U.S. Provisional Application No. 62/737,868, filed Sep. 27, 2018, the entire disclosure of which is hereby incorporated by reference herein.

TECHNICAL FIELD

Embodiments of the present disclosure generally relate to methods for depositing or forming graphene. Some embodiments of the disclosure relate to methods for forming graphene layers on a dielectric substrate. Some embodiments relate to methods for improving the substrate surface quality or deposition parameters while depositing graphene.

BACKGROUND

Graphene has been attracting tremendous amounts of attention in semiconductor manufacturing as a result of its outstanding optical and electrical properties. Due to its unique 2D honeycomb-shaped lattice and one atomic layer structure, graphene, a monolayer of carbon atoms arranged in a hexagonal lattice, has extraordinary potential for the future of the electronics industry. Graphene is the thinnest material, with a thickness of one carbon atom, about 3.35 angstrom. Therefore, graphene has the highest specific surface area (SSA) recorded among carbon materials. This high SSA provides the promising attribute that graphene is able to store more energy than other carbonaceous materials. In addition, the delocalized electrons in graphene sheets are able to travel at high speeds with intrinsic mobility of about $2\text{-}2.5 \times 10^5$ cm$^2$/vs; thereby helping to transport current efficiently. Due to its thin thickness and high electron mobility, graphene can be used as a replacement for traditional metal barrier layers in next generation semiconductor devices because the resistance of metal lines gets higher and higher as their thickness and dimensions continue to shrink. Graphene also demonstrates high optical transparency, which can be used in flexible electronics, for example in smart watch applications.

Traditional graphene CVD growth requires high temperature (>1000 C) and metal foils as catalysts. At this high temperature, most materials used in the electronic applications could be damaged. In addition, the metal foils need to be removed after graphene growth. The transfer process is costly, and could damage graphene layers and cause metal contamination as well. For this reason, low temperature growth without using metal catalysts is highly desirable.

Currently, chemical vapor deposition (CVD) with metal catalysts is used to grow graphene films. Although high quality graphene films can be deposited by CVD growth, it requires high growth temperature, typically 800-1000° C. or more. This is not compatible with current integration flows in the semiconductor industry because the metal lines and low k films on device wafers cannot tolerate such high temperatures. In addition, graphene deposited by high temperature CVD also needs to be transferred from the metal foils. The transfer process is costly and can lead to damage of the film, defects in the film, and metal contamination. Therefore high temperature CVD by known methods is neither convenient nor feasible for industrial applications.

So, direct growth on arbitrary substrates without the use of metal catalysts at relatively lower temperatures is highly desirable.

Accordingly, there is a need for improved methods of depositing graphene layers.

SUMMARY

One or more embodiments of the disclosure are directed to a method of forming a graphene layer. The method comprises exposing a substrate surface comprising a dielectric material to a microwave surface-wave plasma comprising hydrocarbon and hydrogen radicals to form a graphene layer.

Additional embodiments of the disclosure are directed to methods of improving graphene deposition. The methods comprise exposing a substrate surface to an oxygenating plasma to improve one or more substrate surface quality or deposition parameter.

Further embodiments of the disclosure are directed to methods of forming a graphene layer. The methods comprise pretreating a substrate surface comprising a dielectric material by exposing the substrate surface to an oxygenating plasma. The oxygenating plasma comprises O$_2$. The substrate surface is exposed to a microwave surface-wave plasma comprising hydrocarbon and hydrogen radicals to form a graphene layer by igniting acetylene and hydrogen gas. The oxygenating plasma and the microwave surface-wave plasma have a peak power of less than or equal to about 20 kW. The substrate surface is maintained at a temperature of less than or equal to about 750° C. The graphene layer comprises about 5 to about 10 monolayers of graphene and is formed in a period of less than or equal to about 2 minutes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a layer or partial layer has been deposited onto a substrate surface, the exposed surface of the newly deposited layer may also be described as the substrate surface.

Embodiments of the present disclosure relate to methods for forming graphene layers. Further embodiments of the disclosure relate to methods for improving graphene deposition processes. Some embodiments of the disclosure advantageously provide methods for forming graphene layers at lower temperatures. Some embodiments of the disclosure advantageously provide methods for forming graphene layers of a predetermined thickness in a shorter period of time. Some embodiments of the disclosure advantageously provide methods for forming graphene layers with lower resistance.

Figure 1:
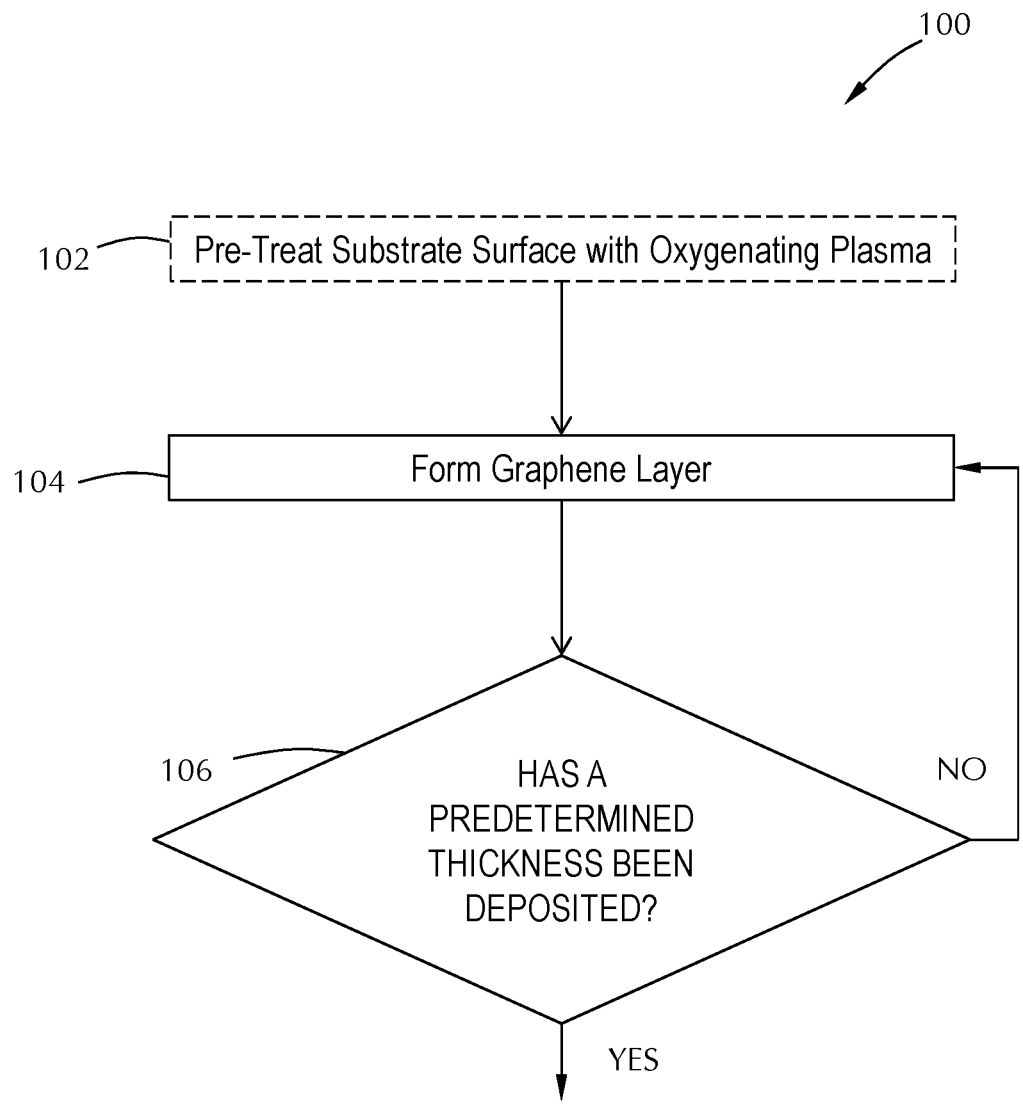
FIG. 1 is a flowchart of a method for forming a graphene layer according to one or more embodiment of the disclosure.

Referring to FIG. 1, a method 100 for forming a graphene layer is shown. The method 100 begins at operation 104 by exposing a substrate surface to a microwave surface-wave plasma.

The substrate surface is the exposed surface of a substrate material. In some embodiments, the substrate material is a dielectric material. In some embodiments, the dielectric material comprises one or more of silicon, silicon oxide, silicon nitride or glass. As used herein, terms such as "silicon oxide" and "silicon nitride" refer to materials comprising silicon and oxygen or silicon and nitrogen. "Silicon oxide" and "silicon nitride" should not be understood to imply any stoichiometric ratio. Stated differently, a dielectric material comprising silicon oxide or silicon nitride may be stoichiometric or non-stoichiometric, silicon-rich or silicon-poor.

In some embodiments, the substrate material comprises substantially no metal atoms. In some embodiments, the substrate material does not consist essentially of metal atoms. As used herein, a material which "consists essentially of" metal atoms comprises greater than 98%, 99%, 99.5% or 99.9% metal atoms on an atomic basis.

The microwave surface-wave plasma is also referred to herein as simply "the plasma". In some embodiments, the plasma has a peak power of less than or equal to 50 kW, less than or equal to 40 kW, less than or equal to 30 kW, less than or equal to 25 kW, less than or equal to 20 kW, or less than or equal to 15 kW. In some embodiments, the plasma has a frequency in the range of about 300 MHz to about 300 GHz, or in the range of about 1 GHz to about 140 GHz, or in the range of about 2 GHz to about 50 GHz, or in the range of about 3 GHz to about 30 GHz, or about 2.45 GHz or about 5.4 GHz.

Without being bound by theory, it is believed that the microwave surface-wave plasma advantageously provides a plasma which has a high radical density but a low energy. It is believed that the higher radical density favors high chemical reactivity and that the low energy minimizes ion bombardment of the substrate and the associated damage and defects.

In some embodiments, the plasma has a radical density (radicals/cm$^3$) of greater than or equal to about $10^{12}$, greater than or equal to about $10^{13}$, greater than or equal to about $10^{14}$, greater than or equal to about $10^{15}$, greater than or equal to about $10^{16}$, or greater than or equal to about $10^{17}$ radicals/cm$^3$. In some embodiments, the plasma has an energy of less than or equal to about 25 eV, less than or equal to about 20 eV, less than or equal to about 15 eV, less than or equal to about 10 eV, less than or equal to about 8 eV, less than or equal to about 6 eV, less than or equal to about 5 eV, less than or equal to about 4 eV, less than or equal to about 2 eV, or less than or equal to about 1 eV. In some embodiments, the plasma has a plasma energy in the range of about 0.1 eV to about 50 eV, or in the range of about 0.5 eV to about 25 eV, or in the range of about 1 eV to about 10 eV.

The plasma comprises hydrocarbon and hydrogen radicals. In some embodiments, a hydrocarbon gas and a hydrogen-containing gas are ignited to form the plasma comprising hydrocarbon and hydrogen radicals. In some embodiments, the plasma is ignited in a region adjacent to the substrate surface within a processing chamber.

The hydrocarbon gas can be any suitable gas comprising carbon atoms and hydrogen atoms. In some embodiments, the hydrocarbon gas consists essentially of carbon atoms and hydrogen atoms. In some embodiments, the hydrocarbon gas has less than or equal to 6 carbon atoms. In some embodiments, the hydrocarbon gas comprises one or more of methane, ethane, propane, butane, ethylene, propene, or acetylene. Without being bound by theory, it is believed that the hydrocarbon radicals primarily react on the substrate surface to form the graphene layers.

The hydrogen-containing gas can may any suitable gas capable of generating hydrogen radicals. In some embodiments, the hydrogen-containing gas comprises or consists essentially of hydrogen gas ($H_2$). Without being bound by theory, it is believed that the hydrogen radicals etch any amorphous carbon generated by the hydrocarbon radicals from the substrate surface. In some embodiments, the graphene layers comprise substantially no amorphous carbon.

In some embodiments, the hydrocarbon gas and the hydrogen-containing gas are delivered to the processing chamber sequentially. In some embodiments, the hydrocarbon gas and the hydrogen-containing gas are delivered to the processing chamber simultaneously. In some embodiments, the hydrocarbon gas and the hydrogen-containing gas are mixed prior to entering the processing chamber. In some embodiments, the hydrocarbon gas and the hydrogen-containing gas are delivered with an inert carrier gas. In some embodiments, the carrier gas comprises argon.

The temperature of the substrate surface may be controlled during formation of the graphene layer. In some embodiments, the substrate surface is maintained at a temperature of less than or equal to about 800° C., less than or equal to about 750° C., less than or equal to about 700° C., less than or equal to about 650° C., less than or equal to about 600° C., less than or equal to about 500° C., less than or equal to about 400° C., less than or equal to about 300°

C., less than or equal to about 200° C., less than or equal to about 100° C., less than or equal to about 50° C., or less than or equal to about 25° C. In some embodiments, the substrate surface is maintained at a temperature in a range of about room temperature (e.g., 25° C.) to about 800° C., about 300° C. to about 800° C., or about 600° C. to about 800° C.

Without being bound by theory, it is believed that CVD processes for forming graphene layers are typically performed at temperatures in excess of 1000° C. The present disclosure provides methods for depositing graphene layers at a lower temperature. It is believed that these lower temperatures are more compatible with the thermal budget of electronic devices during manufacture.

Returning to FIG. 1, the formation process at operation 104 may be performed until a predetermined thickness of graphene has been formed. At operation 106, the thickness of the formed graphene layer is evaluated to determine if it has reached the predetermined thickness. If not, the method 100 returns to operation 104 for further formation. If so, the method 100 ends.

In some embodiments, operation 106 may be able to be conducted while operation 104 is still being performed. Alternatively, in some embodiments, operation 104 may be ceased before and/or during operation 106.

In some embodiments, the graphene layer formed by the disclosed method comprises less than or equal to about 1, less than or equal to about 2, less than or equal to about 5, less than or equal to about 10, less than or equal to about 20, gr less than or equal to about 25, or less than or equal to about 30 monolayers of graphene. In some embodiments, the graphene layer formed by the disclosed method comprises in the range of about 0.5 to about 25 monolayers, or in the range of about 0.5 to about 10 monolayers, or in the range of about 1 to about 5 monolayers, or in the range of about 5 to about 10 monolayers of graphene. In some embodiments, the graphene layer formed by the disclosed method has a thickness of less than or equal to about 3 Å, less than or equal to about 5 Å, less than or equal to about 10 Å, less than or equal to about 15 Å, less than or equal to about 20 Å, less than or equal to about 25 Å, less than or equal to about 30 Å, less than or equal to about 40 Å, or less than or equal to about 50 Å.

In some embodiments, the method 100 is capable of being performed in a relatively short time period. In some embodiments, the graphene layer is formed in a period of less than or equal to about 15 minutes, less than or equal to about 10 minutes, less than or equal to about 5 minutes, less than or equal to about 2 minutes, or less than or equal to about 1 minute.

In some embodiments, the resistance of the graphene layer formed by the disclosed method is relatively low. In some embodiments, the graphene layer has a resistance of less than or equal to about 2000 ohm/square, less than or equal to about 1000 ohm/square, less than or equal to about 500 ohm/square, less than or equal to about 400 ohm/square, less than or equal to about 300 ohm/square, less than or equal to about 250 ohm/square, or less than or equal to about 200 ohm/square.

Figure 2:
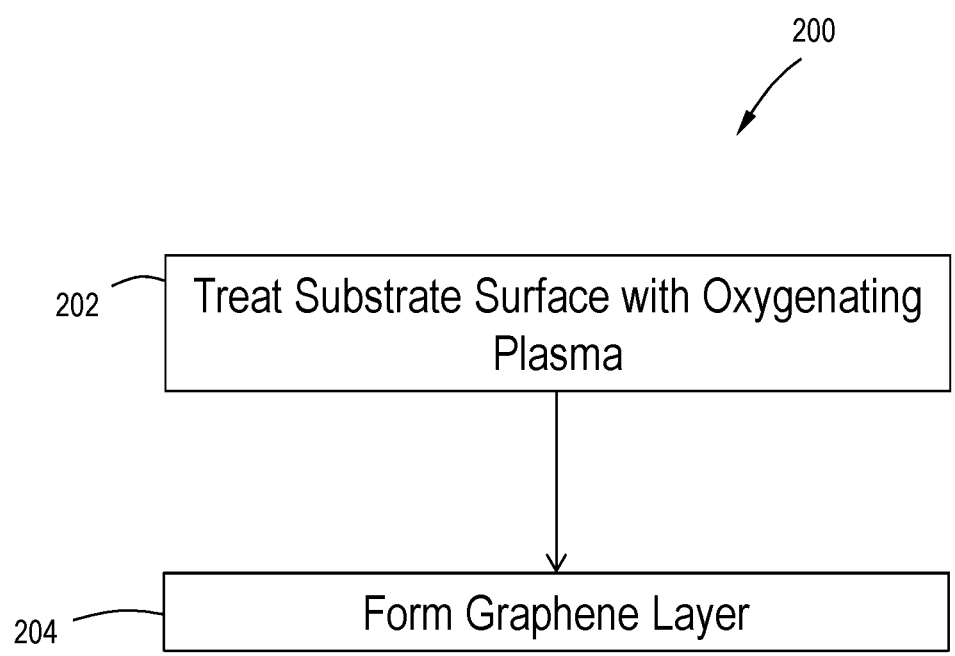
FIG. 2 is a flowchart of a method for improving graphene deposition according to one or more embodiment of the disclosure.

Referring to FIG. 2, a method 200 of improving graphene deposition is shown. The method 200 comprises, at 202, exposing a substrate surface to an oxygenating plasma to improve one or more substrate surface quality or deposition parameter. Next, at 204, a graphene layer is formed on the substrate surface.

In some embodiments, the method 200 can be incorporated into method 100 as optional operation 102. In some embodiments, method 200 is practiced apart from method 100 with a different graphene formation process.

The substrate surface for method 200 may be comprised of any suitable substrate material, including dielectrics and metals. In some embodiments, the substrate material is a dielectric material. In some embodiments, the substrate material consists essentially of a metal. In some embodiments, the substrate material comprises copper.

The oxygenating plasma may comprise any suitable materials capable of electrochemically oxidizing the substrate surface. Without being bound by theory, it is believed that oxidizing the substrate surface removes any hydrogen terminations as well as any other potential contaminants. The treated substrate surface is able to provide a smooth, clean surface for graphene formation. In some embodiments, the oxygenating plasma comprises $O_2$ or $H_2O$.

The oxygenating plasma may be generated by any suitable plasma source. In some embodiments, the oxygenating plasma comprises a microwave plasma. In some embodiments, the oxygenating plasma comprises a remotely generated plasma. In some embodiments, the oxygenating plasma comprises a direct plasma. In some embodiments, the oxygenating plasma comprises a conductively coupled plasma (CCP). In some embodiments, the oxygenating plasma comprises an inductively coupled plasma (ICP).

The temperature of the substrate surface may be controlled during exposure to the oxygenating plasma. In some embodiments, the substrate surface is maintained at a temperature of less than or equal to about 800° C., less than or equal to about 750° C., less than or equal to about 700° C., less than or equal to about 650° C., less than or equal to about 600° C., less than or equal to about 500° C., less than or equal to about 400° C., less than or equal to about 300° C., less than or equal to about 200° C., less than or equal to about 100° C., less than or equal to about 50° C., or less than or equal to about room temperature (e.g., 25° C.). In some embodiments, the substrate surface is maintained at a temperature in a range of about room temperature (e.g., 25° C.) to about 800° C., about 300° C. to about 800° C., or about 600° C. to about 800° C.

In some embodiments, the oxygenating plasma has a peak power of less than or equal to 50 kW, less than or equal to 40 kW, less than or equal to 30 kW, less than or equal to 25 kW, less than or equal to 20 kW, or less than or equal to 15 kW.

In some embodiments, the improved substrate surface quality is increased smoothness. In some embodiments, the improved substrate surface quality is decreased hydrogen concentration. In some embodiments, the improved substrate surface quality is decreased contamination. These improvements are measured relative to a substrate surface which has not been treated with an oxygenating plasma.

In some embodiments, the improved deposition parameter is increased film thickness. In some embodiments, the improved deposition parameter is decreased film resistance. In some embodiments, the improved deposition parameter is increased uniformity. These improvements are relative to a graphene layer deposited by similar process parameters (e.g., reactants, temperature, plasma power, deposition time) on substrate surface which has not been treated with an oxygenating plasma.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a graphene layer, the method comprising:
   exposing a substrate surface comprising a dielectric material to an oxygenating plasma, the dielectric material comprising one or more of silicon, silicon nitride or glass; and
   exposing the substrate surface to a microwave surface-wave plasma comprising hydrocarbon and hydrogen radicals to form a graphene layer.

2. The method of claim 1, wherein the oxygenating plasma comprises $O_2$ or $H_2O$.

3. The method of claim 1, wherein the microwave surface-wave plasma has a peak power of less than or equal to 25 kW.

4. The method of claim 1, wherein the microwave surface-wave plasma has a radical density of greater than or equal to $10^{12}$ radicals/cm$^3$.

5. The method of claim 1, wherein the microwave surface-wave plasma has an energy of less than or equal to 10 eV.

6. The method of claim 1, wherein a hydrocarbon gas and a hydrogen-containing gas are ignited to form the microwave surface-wave plasma comprising hydrocarbon and hydrogen radicals.

7. The method of claim 6, wherein the hydrocarbon gas comprises one or more of methane, ethane, propane, butane, ethylene, propene, or acetylene.

8. The method of claim 1, wherein the substrate surface is maintained at a temperature of less than or equal to 800° C.

9. The method of claim 1, wherein the graphene layer comprises 5 to 10 monolayers of graphene.

10. The method of claim 9, wherein the graphene layer is formed in a period of less than or equal to 15 minutes.

11. The method of claim 1, wherein the graphene layer has a resistance of less than or equal to 500 ohm/square.

12. A method of forming a graphene layer, the method comprising:
    pretreating a substrate surface comprising a dielectric material by exposing the substrate surface to an oxygenating plasma, the oxygenating plasma comprising $O_2$, the dielectric material comprising one or more of silicon, silicon nitride or glass; and
    exposing the substrate surface to a microwave surface-wave plasma comprising hydrocarbon and hydrogen radicals to form a graphene layer by igniting acetylene and hydrogen gas,
    wherein the oxygenating plasma and the microwave surface-wave plasma have a peak power of less than or equal to 20 kW, the substrate surface is maintained at a temperature of less than or equal to 750° C., the graphene layer comprises 5 to 10 monolayers of graphene and is formed in a period of less than or equal to 2 minutes.

13. A method of forming a graphene layer, the method comprising:
    exposing a substrate surface comprising a dielectric material to an oxygenating plasma; and
    exposing the substrate surface to a microwave surface-wave plasma comprising hydrocarbon and hydrogen radicals to form a graphene layer, the microwave surface-wave plasma having a radical density of greater than or equal to $10^{12}$ radicals/cm$^3$.

14. The method of claim 13, wherein the dielectric material comprises one or more of silicon, silicon oxide, silicon nitride or glass.

15. The method of claim 13, wherein the dielectric material comprises one or more of silicon, silicon oxide, silicon nitride or glass.

16. The method of claim 13, wherein the microwave surface-wave plasma has a peak power of less than or equal to 25 kW.

17. The method of claim 13, wherein the microwave surface-wave plasma has an energy of less than or equal to 10 eV.

18. The method of claim 13, wherein a hydrocarbon gas and a hydrogen-containing gas are ignited to form the microwave surface-wave plasma comprising hydrocarbon and hydrogen radicals.

19. The method of claim 18, wherein the hydrocarbon gas comprises one or more of methane, ethane, propane, butane, ethylene, propene, or acetylene.

20. The method of claim 13, wherein the substrate surface is maintained at a temperature of less than or equal to 800° C.

* * * * *